(12) United States Patent
Smith et al.

(10) Patent No.: US 9,136,504 B2
(45) Date of Patent: Sep. 15, 2015

(54) ORGANIC ELECTROLUMINESCENT DEVICE

(75) Inventors: Euan C. Smith, Cambridgeshire (GB); Faisal Qureshi, Cheshire (GB); Jan Jongman, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 2467 days.

(21) Appl. No.: 11/659,560

(22) PCT Filed: Aug. 4, 2005

(86) PCT No.: PCT/GB2005/003060
§ 371 (c)(1),
(2), (4) Date: Jan. 3, 2008

(87) PCT Pub. No.: WO2006/013373
PCT Pub. Date: Feb. 9, 2006

(65) Prior Publication Data
US 2011/0042696 A1    Feb. 24, 2011

(30) Foreign Application Priority Data

Aug. 4, 2004 (GB) .................................. 0417351.4
May 25, 2005 (GB) .................................. 0510719.8

(51) Int. Cl.
*H01L 35/24* (2006.01)
*H01L 51/52* (2006.01)
(Continued)

(52) U.S. Cl.
CPC ........ *H01L 51/5265* (2013.01); *H01L 21/0276* (2013.01); *H01L 27/3209* (2013.01);
(Continued)

(58) Field of Classification Search
CPC ............ H01L 27/3209; H01L 51/5206; H01L 51/5221; H01L 51/5271; H01L 21/0276; H01L 33/504; H01L 2924/12041; H01L 33/44
USPC ........................................................ 257/89, 98
See application file for complete search history.

(56) References Cited

U.S. PATENT DOCUMENTS 4,539,507 A    9/1985    VanSlyke et al.
6,307,528 B1  10/2001    Yap
(Continued)

FOREIGN PATENT DOCUMENTS

EP    0 616 488 A2    9/1994
EP    0 880 303 A1    11/1998
(Continued)

OTHER PUBLICATIONS

Dodabalapur et al., "Physics and Applications of Organic Microcavity Light Emitting Diodes," *J. Appl. Phys.*, 80(12):6954-6964 (1996).
(Continued)

*Primary Examiner* — Howard Weiss
*Assistant Examiner* — Tifney Skyles
(74) *Attorney, Agent, or Firm* — Marshall, Gerstein & Borun LLP

(57) ABSTRACT

An organic electroluminescent device comprising: a transparent substrate; a first electrode disposed over the substrate for injecting charge of a first polarity; a second electrode disposed over the first electrode for injecting charge of a second polarity opposite to said first polarity; an organic light-emitting layer disposed between the first and the second electrode, wherein the second electrode is reflective, the first electrode is transparent or semi-transparent, and one or more intermediate layers of dielectric material with a refractive index greater than 1.8 or a metal material is disposed between the substrate and the first electrode forming a semi-transparent mirror whereby a microcavity is provided between the reflective second electrode and the semi-transparent mirror, all the intermediate layers disposed between the substrate and the first electrode having a surface nearest the organic light-emitting layer not more than 150 nm from a surface of the first electrode nearest the organic light-emitting layer.

60 Claims, 12 Drawing Sheets

(51) Int. Cl.
    *H01L 27/32*     (2006.01)
    *H01L 33/44*     (2010.01)
    *H01L 33/50*     (2010.01)
    *H01L 21/027*     (2006.01)

(52) U.S. Cl.
    CPC .............. *H01L33/44* (2013.01); *H01L 33/504* (2013.01); *H01L 51/5206* (2013.01); *H01L 51/5221* (2013.01); *H01L 51/5271* (2013.01); *H01L 27/322* (2013.01); *H01L 2924/12041* (2013.01)

(56) References Cited

U.S. PATENT DOCUMENTS

| | | | |
|---|---|---|---|
| 6,861,800 B2 * | 3/2005 | Tyan et al. | 313/506 |
| 2003/0107314 A1 * | 6/2003 | Urabe et al. | 313/506 |
| 2004/0256983 A1 * | 12/2004 | Hung et al. | 313/506 |
| 2005/0037232 A1 * | 2/2005 | Tyan et al. | 428/690 |
| 2005/0099118 A1 | 5/2005 | Kobayashi | |

FOREIGN PATENT DOCUMENTS

| | | |
|---|---|---|
| EP | 1 401 034 A2 | 3/2004 |
| JP | 2000/068069 | 3/2000 |
| WO | WO-90/13148 A1 | 11/1990 |
| WO | WO-95/06400 A1 | 3/1995 |
| WO | WO-99/21935 A1 | 5/1999 |
| WO | WO-99/48160 A1 | 9/1999 |
| WO | WO-00/76010 A1 | 12/2000 |
| WO | WO-02/067343 A1 | 8/2002 |
| WO | WO-03/105248 A1 | 12/2003 |

OTHER PUBLICATIONS

Neyts et al., "Semitransparent Metal or Distributed Bragg Reflector for Wide-viewing-angle Organic Light-emitting-diode Microcavities," *J. Opt. Soc. Am. B.*, 17(1):114-119 (2000).

Shiga et al., "Design of Multiwavelength Resonant Cavities for White Organic Light-emitting Diodes," *J. Appl. Phys.*, 93(1):19-22 (2003).

Combined Search and Examination Report for GB Application No. GB0417351.4, dated Oct. 21, 2004.

International Preliminary Report on Patentability for International Application No. PCT/GB2005/003060, dated Feb. 15, 2007.

International Search Report for International Application No. PCT/GB2005/003060, dated Jan. 30, 2006.

* cited by examiner

ORGANIC ELECTROLUMINESCENT DEVICE

This is the U.S. national phase of International Application No. PCT/GB2005/004060 filed Aug. 4, 2005, the entire disclosure of which is hereby incorporated herein by reference.

BACKGROUND OF THE INVENTION

1. Field of the Invention

A first aspect of the invention relates to an organic electroluminescent device. This first aspect also relates to a substrate for an organic electroluminescent device.

A second aspect of the invention relates to a multilayer display device. It is particularly suitable, but by no means limited, to multilayer display devices fabricated using organic light emitting diodes.

2. Related Technology

First Aspect

Organic electroluminescent devices are known, for example from PCT/WO/13148 and U.S. Pat. No. 4,539,507. Such devices generally comprise a substrate 2, a first electrode 4 disposed over the substrate 2 for injecting charge of a first polarity; a second electrode 6 disposed over the first electrode 4 for injecting charge of a second polarity opposite to said first polarity; an organic light-emitting layer 8 disposed between the first and the second electrodes; and an encapsulant 10 disposed over the second electrode 6. In one arrangement shown in FIG. 1, the substrate 2 and the first electrode 4 are transparent to allow light emitted by the organic light-emitting layer 8 to pass therethrough. Such an arrangement is known as a bottom-emitting device. In another arrangement shown in FIG. 2, the second electrode 6 and the encapsulant 10 are transparent so as to allow light emitted from the organic light-emitting layer 8 to pass therethrough. Such an arrangement is known as a top-emitting device.

Variations of the above-described structures are known. The first electrode may be the anode and the second electrode may be the cathode. Alternatively, the first electrode may be the cathode and the second electrode may be the anode. Further layers may be provided between the electrodes and the organic light-emitting layer in order to aid charge injection and transport. The organic material in the light-emitting layer may comprise a small molecule, a dendrimer or a polymer and may comprise phosphorescent moieties and/or fluorescent moieties. The light-emitting layer may comprise a blend of materials including light emitting moieties, electron transport moieties and hole transport moieties. These may be provided in a single molecule or on separate molecules.

By providing an array of devices of the type described above, a display may be formed comprising a plurality of emitting pixels. The pixels may be of the same type to form a monochrome display or they may be different colors to form a multicolor display.

A problem with organic electroluminescent devices is that much of the light emitted by organic light-emitting material in the organic light-emitting layer does not escape from the device. The light may be lost within the device by scattering, internal reflection, waveguiding, absorption and the like. This results in a reduction in the efficiency of the device. Furthermore, these optical effects can lead to low image intensity, low image contrast, ghosting and the like resulting in poor image quality.

A further problem with organic electroluminescent devices is that of achieving intense, narrow band-width emission so as to improve the color purity of emission.

One way of solving the aforementioned problems is to utilize microcavity effects within a device.

A microcavity is formed when the organic light-emitting layer is disposed between two reflecting mirrors, one of which is semitransparent. The photon density of states is modified such that only certain wavelengths, which correspond to allowed cavity modes, are emitted with emission intensity being enhanced in a direction perpendicular to the layers of the device. Thus emission near the wavelength corresponding to the resonance wavelength of the cavity is enhanced through the semitransparent mirror and emission at wavelengths away from the resonance is suppressed.

A weak microcavity is achievable using a standard device structure of the type described above. For example, in a bottom-emitting device such as that illustrated in FIG. 1, a metal cathode 6 is generally utilized along with an ITO anode 4. The metal cathode is highly reflective while the ITO is substantially transparent but is weakly reflective. This weak reflectivity of ITO can result in a weak cavity effect. However, ITO provides a poor cavity not only because it is weak, but also because its refractive index is very variable over the visible spectrum. This results in variable performance with difference wavelengths and viewing angles.

In light of the above, it is known to alter the structure of organic electroluminescent devices in order to provide an improved microcavity effect.

U.S. Pat. No. 6,861,800 discloses several modified arrangements. In one arrangement, illustrated in FIG. 3a of U.S. Pat. No. 6,861,800, the ITO anode is replaced with a semitransparent silver anode. A stronger microcavity is thus formed between the semitransparent silver anode and a reflective silver cathode when compared with an arrangement using an ITO anode as illustrated in FIG. 3b of U.S. Pat. No. 6,861,800. In fact, the microcavity effect of ITO is so low that in U.S. Pat. No. 6,861,800 such an arrangement is described as having no microcavity.

One problem with replacing the anode electrode with a stronger mirror is that the electrical properties of the device will be altered.

In U.S. Pat. No. 6,861,800 an alternative arrangement shown in FIG. 3c has been proposed in which a Quarter Wave Stack (alternatively known as a Distributed Bragg Reflector) is disposed between the ITO anode and transparent substrate. A QWS is a multi-layer stack of alternating high and low index dielectric layers which may be tuned so as to have very high reflectance, very low transmittance and practically zero absorbance over a given range of wavelengths. Such an arrangement provides a very strong microcavity.

WO 00/76010 also discloses the use of QWS between a substrate and an anode of a bottom-emitting device. As in U.S. Pat. No. 6,861,800, ITO is not considered to contribute a cavity effect in the device and is described as transmissive.

In "A. Dodabalapur et al., Physics and applications of organic microcavity light emitting diodes, J. Appl. Phys. 80 (12), 1996, 6954-6964" an arrangement is disclosed in which a QWS and a filler layer are provided between a transparent substrate and an ITO anode. The filler layer is of variable thickness so as to provide a number of cavities tuned to different colors. As in the aforementioned documents, the ITO anode is not considered to contribute a cavity effect in the device and is described as transmissive.

One problem with arrangements which utilize a QWS is that the microcavity can be too strong. Although the absorbance of the QWS is practically zero, the layers of material between the QWS and the cathode do absorb light. Thus, because light is trapped in the cavity until it enters a mode which can pass through the low transmittance QWS, absorption of light by layers of material within the cavity becomes significant. Furthermore, the QWS results in a very narrow emission resulting in a narrow viewing angle and the color of the emission changes with viewing angle. Additionally, a QWS is complicated and expensive to manufacture requiring the deposition of a number of additional layers and increases the thickness of the finished device.

Another problem with arrangements which utilize a QWS is that the microcavity can be too large. Utilizing a QWS, the net effect of reflection from the stack of layers occurs approximately in the middle of the stack. As such, the distance between the net reflection from the QWS and the reflecting electrode forming the other side of the microcavity is large. The mode spacing is thus small as the mode spacing of a microcavity is inversely proportional to the size of the microcavity. With a large microcavity, while some parts of the spectrum are enhanced, other parts of the spectrum are reduced in intensity due to the small mode spacing allowing many modes to be accessed. As a result, although spectral narrowing with an increase in intensity of certain wavelengths can be achieved with a QWS, the overall enhancement of light output may be minimal due to reduction in intensity in other parts of the spectrum.

In "T Shiga, Design of multiwavelength resonance cavities for white organic light-emitting diodes, J. Appl. Phys. 93 (1), 2003, 19-22" an organic electroluminescent device is disclosed in which two microcavities are provided. Such an arrangement is illustrated in FIG. 2 of this document. A first cavity is formed between an ITO anode and a cathode. A second cavity is formed between the cathode and a layer of high refractive index dielectric material spaced apart from the ITO anode by a spacer layer of a low refractive index dielectric material. Such an arrangement is designed to produce two emission peaks in different areas of the visible spectrum which mix to form a white emission.

One problem with this arrangement is that it is not suitable for improving the color purity of emission as it is specifically directed to producing a white emission. Another problem with this arrangement is that, as stated previously, the ITO layer does not form a good cavity.

Second Aspect

Displays fabricated using organic light emitting diodes (OLEDs) provide a number of advantages over other flat panel technologies. They are bright, colorful, fast-switching, provide a wide viewing angle and are easy and cheap to fabricate on a variety of substrates. Organic (which here includes organometallic) LEDs may be fabricated using materials including polymers, small molecules and dendrimers, in a range of colors which depend upon the materials employed. Examples of polymer-based organic LEDs are described in WO 90/13148, WO 95/06400 and WO 99/48160; examples of dendrimer-based materials are described in WO 99/21935 and WO 02/067343; and examples of so called small molecule based devices are described in U.S. Pat. No. 4,539,507.

A typical OLED device comprises two layers of organic material, one of which is a layer of light emitting material such as a light emitting polymer (LEP), oligomer or a light emitting low molecular weight material, and the other of which is a layer of a hole transporting material such as a polythiophene derivative or a polyaniline derivative.

Organic LEDs may be deposited on a substrate in a matrix of pixels to form a single or multi-color pixellated display. A multicolored display may be constructed using groups of red, green, and blue emitting pixels. So-called active matrix displays have a memory element, typically a storage capacitor and a transistor, associated with each pixel while passive matrix displays have no such memory element and instead are repetitively scanned to give the impression of a steady image. Other passive displays include segmented displays in which a plurality of segments share a common electrode and a segment may be lit up by applying a voltage to its other electrode. A simple segmented display need not be scanned but in a display comprising a plurality of segmented regions the electrodes may be multiplexed (to reduce their number) and then scanned.

FIG. 12 shows a vertical cross section through an example of an OLED device 100. In an active matrix display part of the area of a pixel is occupied by associated drive circuitry (not shown in FIG. 12). The structure of the device is somewhat simplified for the purposes of illustration.

The OLED 100 comprises a substrate 102, typically 0.7 mm or 1.1 mm glass but optionally clear plastic or some other substantially transparent material. An anode layer 104 is deposited on the substrate, typically comprising around 150 nm thickness of ITO (indium tin oxide), over part of which is provided a metal contact layer. Typically the contact layer comprises around 500 nm of aluminium, or a layer of aluminium sandwiched between layers of chrome, and this is sometimes referred to as anode metal. Glass substrates coated with ITO and contact metal are available from Corning, USA. The contact metal over the ITO helps provide reduced resistance pathways where the anode connections do not need to be transparent, in particular for external contacts to the device. The contact metal is removed from the ITO where it is not wanted, in particular where it would otherwise obscure the display, by a standard process of photolithography followed by etching.

A substantially transparent hole transport layer 106 is deposited over the anode layer, followed by an electroluminescent layer 108, and a cathode 110. The electroluminescent layer 108 may comprise, for example, a PPV (poly(p-phenylenevinylene)) and the hole transport layer 106, which helps match the hole energy levels of the anode layer 104 and electroluminescent layer 108, may comprise a conductive transparent polymer, for example PEDOT:PSS (polystyrene-sulphonate-doped polyethylene-dioxythiophene) from Bayer AG of Germany. In a typical polymer-based device the hole transport layer 106 may comprise around 200 nm of PEDOT; a light emitting polymer layer 108 is typically around 70 nm in thickness.

These organic layers may be deposited by spin coating (afterwards removing material from unwanted areas by plasma etching or laser ablation) or by inkjet printing. In this latter case banks 112 may be formed on the substrate, for example using photoresist, to define wells into which the organic layers may be deposited as disclosed in, for example, EP 0880303. Such wells define light emitting areas or pixels of the display.

Cathode layer 110 typically comprises a low work function metal such as calcium or barium (for example deposited by physical vapour deposition) covered with a thicker, capping layer of aluminium. Optionally an additional layer may be provided immediately adjacent the electroluminescent layer, such as a layer of lithium fluoride, for improved electron energy level matching. Mutual electrical isolation of cathode lines may achieved or enhanced through the use of cathode separators (not shown in FIG. 12).

The same basic structure may also be employed for small molecule devices.

Typically a number of displays are fabricated on a single substrate and at the end of the fabrication process the substrate is scribed, and the displays separated before an encapsulating can is attached to each to inhibit oxidation and moisture ingress.

To illuminate the OLED power is applied between the anode and cathode, represented in FIG. 12 by battery 118. In the example shown in FIG. 12 light is emitted through transparent anode 104 and substrate 102 and the cathode is generally reflective; such devices are referred to as "bottom emitters."

Organic LEDs may be deposited on a substrate in a matrix of pixels to form a single or multi-color pixellated display. A multicolored display may be constructed using groups of red, green, and blue emitting pixels. In such displays the individual elements are generally addressed by activating row (or column) lines to select the pixels, and rows (or columns) of pixels are written to, to create a display. So-called active matrix displays have a memory element, typically a storage capacitor and a transistor, associated with each pixel while passive matrix displays have no such memory element and instead are repetitively scanned, somewhat similarly to a TV picture, to give the impression of a steady image.

Referring now to FIG. 13, this shows a simplified cross-section through a passive matrix OLED display device 150, in which like elements to those of FIG. 12 are indicated by like reference numerals. As shown the hole transport 106 and electroluminescent 108 layers are subdivided into a plurality of pixels 152 at the intersection of mutually perpendicular anode and cathode lines defined in the anode 104 and cathode layer 110 respectively. In the figure conductive lines 154 defined in the cathode layer 110 run into the page and a cross-section through one of a plurality of anode lines 158 running at right angles to the cathode lines is shown. An electroluminescent pixel 152 at the intersection of a cathode and anode line may be addressed by applying a voltage between the relevant lines. The anode layer 104 provides external contacts to the display 150 and may be used for both anode and cathode connections to the OLEDs (by running the cathode layer pattern over anode metal lead-outs).

The above mentioned OLED materials, and in particular the light emitting polymer material and the cathode, are susceptible to oxidation and to moisture. The device is therefore often encapsulated in a metal can 111, attached by UV-curable epoxy glue 113 onto anode metal layer 104, small glass beads within the glue preventing the metal can touching and shorting out the contacts. Preferably the anode metal contacts are thinned where they pass under the lip of the metal can 111 to facilitate exposure of glue 113 to UV light for curing.

Conventional metal cathodes 110 are inherently reflective. As a consequence, a problem experienced with prior OLED devices is that the displayed image is degraded by the reflection of ambient light from the cathode 110. This reflected light combines with the light that is being intentionally emitted by the OLED device when forming an image. This gives rise to an image that suffers from poorer contrast and worse color depth than desired.

One method used to reduce the amount of reflected light is to apply a circular polarizer coating on the outside of the substrate 102. However, the use of a circular polarizer necessitates increased power consumption and reduces contrast.

Another method to reduce the amount of reflected light is to use a contrast-enhancing stack available from Luxell of Ontario, Canada under the name "Black Layer". As shown in FIG. 14, the Black Layer is a multilayer structure 202, 204, 206 (rather than a single layer as its name might otherwise suggest) that replaces the traditional metal cathode 110. This is a destructive-optical-interference multilayer filter, which is incorporated between the opaque electrode and the organic stack. A thin (ca. 20 Å) metal layer 202 (e.g. barium) is first applied next to the electroluminescent layer 108, and then a semi-transparent layer 204 phase-changing layer incorporating a transparent conducting oxide (e.g. a Cr:SiO layer 100 nm thick or a SiO based layer) is deposited on the thin metal layer. Finally, a thick layer of reflective metal 206 (e.g. aluminium) forming the cathode is deposited on the semi-transparent layer 204. Incident ambient light passing through the substrate 102 is reflected by both the thin metal layer 202 and the thick metal layer 206. The thickness of the intermediate semi-transparent layer 204 is selected such that light reflected from the thin metal layer 202 is 180° out of phase compared with light reflected from the thick metal layer 206. Light rays reflected from the two metal layers combine destructively, thereby reducing the amount of reflected ambient light. Other destructive interference systems utilising a half-wavelength spacing layer located on the cathode side of an OLED are disclosed in, for example, WO 00/35028 and JP 08-008065. A display using such an interference system requires less power than one with a circular polarizer, and provides higher contrast.

The inventors have found that a further contrast reducing reflection results from reflection of light at the interface between the anode 104 and the substrate 102. Due to the relatively high refractive index of a typical ITO anode 104 compared with the relatively low refractive index of a typical glass substrate 102, 10% of the ambient light intensity can be reflected from the anode/substrate boundary. There is a desire to reduce the intensity of light reflected from this boundary to the order of 1%, to provide a comparable level of reflection to that which would be achieved by circular polarizers (which, as mentioned above, are disadvantageous in that they necessitate increased power consumption and reduce contrast).

It may be possible to utilize light reflected from a layer such as a Black Layer located on the cathode side of an OLED to destructively interfere with light reflected at the anode/substrate boundary. However, this requires adjustment for the effects of thickness, refractive index, etc of the intervening organic layer and as such represents a complex method of minimising reflections at the anode.

GENERAL DESCRIPTION OF THE INVENTION

The invention addresses one or more of the problems described above.

According to the first aspect of the invention there is provided an organic electroluminescent device comprising:
a transparent substrate;
a first electrode disposed over the substrate for injecting charge of a first polarity;
a second electrode disposed over the first electrode for injecting charge of a second polarity opposite to said first polarity;
an organic light-emitting layer disposed between the first and the second electrode, wherein the second electrode is reflective, the first electrode is transparent or semi-transparent, and one or more intermediate layers of dielectric material with a refractive index greater than 1.8 or a metal material disposed between the substrate and the first electrode forming a semi-transparent mirror whereby a microcavity is provided between the reflective second electrode and the semi-transparent mirror, all the intermediate layers disposed between the substrate and the first electrode having a surface nearest the organic light-emitting layer not more than 150 nm from a surface of the first electrode nearest the organic light-emitting layer.

The provision of intermediate layers disposed between the substrate and the first electrode all of which have a surface nearest the organic light-emitting layer not more than 150 nm from a surface of the first electrode nearest the organic light-emitting layer results in an increase in out-coupling of light from the device and also improves color purity. Furthermore, no change in color with viewing angle is observed.

The provision of intermediate layers having surfaces within 150 nm of the upper surface of the first electrode of material avoids the aforementioned problems associated with the use of a QWS as the resultant microcavity is not as strong. Unlike the QWS, the intermediate layers do absorb some light. However, as the microcavity formed is weaker than that formed by a QWS, light emitted from the light-emitting layer is not trapped so strongly within the cavity. As a result, absorption from the other layers of material within the cavity is reduced. Surprisingly, it has been found that any increase in absorbance by the intermediate layers when compared to a QWS can be off-set by a reduction in absorbance by the other layers within the cavity while still achieving the advantages of colour color enhancement provided by a microcavity. Furthermore, the intermediate layers form a smaller microcavity when compared with a QWS as the net reflection from the intermediate layers is closer to the second reflecting electrode than the net reflection achieved from a QWS. As such, the mode spacing is larger for the intermediate layers compared to a QWS. Accordingly, less modes are accessible which results in a decrease in the intensity of certain parts of the spectrum resulting in an overall enhancement of the spectrum which is superior to a QWS.

As the intermediate layers are not disposed between the two electrodes, the electrical properties of the device are not altered and the electrode materials do not need to be changed. The electrodes are generally selected for their charge injection properties which depend on the work function of the materials used. For example, it has been found that ITO has a work function which can be tuned so as to achieve good hole injection. Furthermore, organic materials for emission and charge transport have been optimized by the present applicant for use with ITO anodes. Accordingly, the present applicant would preferably like to avoid changing the electrodes of the electroluminescent device based on their optical properties.

Additionally, unlike in "T Shiga, Design of multiwavelength resonance cavities for white organic light-emitting diodes, J. Appl. Phys. 93 (1), 2003, 19-22", the intermediate layers are placed such that they have a surface not more than 150 nm from a surface of the first electrode nearest the organic light-emitting layer. With the presently proposed arrangement, a single cavity effect is observed rather than two separate cavity effects from the ITO and the high index dielectric material as in the prior art document. The presently proposed arrangement allows for color enhancement and also avoids the aforementioned problems with using ITO alone to form a microcavity. The microcavity of embodiments of the invention is stronger than that which can be achieved with a standard ITO electrode. In fact, the microcavity formed by embodiments of the invention is of a strength intermediate between that achieved using ITO alone and that achieved by using a QWS.

Thus, the invention enhances the small reflectivity of the first electrode by the provision of intermediate layers placed such that they have a surface not more than 150 nm from a surface of the first electrode nearest the organic light-emitting layer in order that the electrode and the intermediate layers together form a single microcavity with the reflective second electrode. The resultant microcavity is of intermediate strength compared with the prior art microcavities. The present applicant has found that such a microcavity provides good properties for displays, e.g. high color purity, low change in color with viewing angle, increased out-coupling of light, low absorption within the device and simple device manufacture.

While not being bound by theory, to form one effective microcavity providing a single enhanced, phase shifted optical peak, the upper surface of the intermediate layers and the upper surface of the first electrode layer should be less than a quarter of the wavelength of the light emitted by the light-emitting layer.

Alternatively, again not being bound by theory, to form one effective microcavity the distance between the upper surface of the intermediate layers and the upper surface of the first electrode layer should be small enough whereby a supported mode has a width (which is inversely proportional to this distance) which is greater than the emission band width from the light-emitting layer. With such an arrangement any additional modes supported by the intermediate layers do not lead to spectral narrowing and accordingly only one microcavity effect is observed.

Preferably, the distance between the upper surface of the or each intermediate layer and the upper surface of the first electrode is less than 150 nm (¼×600 nm). This arrangement ensures that only one effective microcavity is formed over the red part of the visible spectrum. More preferably still, the distance between the upper surface of the or each intermediate layer and the upper surface of the first electrode is less than 125 nm (¼×500 nm). This arrangement ensures that only one effective microcavity is formed over the green and red parts of the visible spectrum. Most preferably, the distance between the upper surface of the or each intermediate layer and the upper surface of the first electrode is less than 110 nm (¼×440 nm). This arrangement ensures that only one effective microcavity is formed over the blue, green and red parts of the visible spectrum.

Preferably, the or each intermediate layer of material is transparent to visible light having a wavelength over 600 nm. More preferably, the or each intermediate layer of material is transparent to visible light having a wavelength over 500 nm. Most preferably, the or each intermediate layer of material is transparent to visible light having a wavelength over 400 nm. The particular transparency required will depend on the emission frequency of the light-emitting layer. In multicolored display devices, a common layer transparent to all visible frequencies is preferred.

Preferably, the or each intermediate layer of material comprises independently one of titanium dioxide, silicon oxynitride, silicon nitride, zinc sulphide, silver and silver alloys.

For metallic intermediate layers, advantageously the or each intermediate layer is 1-20 nm thick, more preferably 1-10 nm, more preferably still 3-7 nm thick and most preferably around 5 nm thick. A thin layer will be cheaper and quicker to deposit and will minimize the increase in thickness of the layered structure. This may be advantageous in that no additional changes to a manufacturing method may be needed. For example, encapsulant cavities may not need to be increased in size to compensate for the additional layer or layers.

For a high refractive index dielectric intermediate layer, advantageously the or each intermediate layer is 10-100 nm thick, more preferably 20-70 nm, more preferably still 30-50 nm thick and most preferably around 40 nm thick.

Preferably, the first electrode is transparent to visible light having a wavelength over 600 nm. More preferably, the first electrode is transparent to visible light having a wavelength over 500 nm. Most preferably, the first electrode is transparent to visible light having a wavelength over 400 nm whereby the first electrode is transparent over substantially all the visible spectrum.

Preferably, the first electrode has a work function over 4.0 eV. Preferably the first electrode comprises ITO.

Preferably the transparent substrate has a refractive index of between 1.4 and 1.7. Glass sheets are preferable for rigid devices due to their inertness and their impermeability to air and moisture. Plastic sheets are useful for flexible devices.

Preferably the substrate comprises a color filter. In the off state, light reflected by a microcavity is not the same color as that emitted by the microcavity in the on-state. Accordingly, a color filter may be added so as to transmit the color of light emitted by the micro-cavity in the on state while absorbing light of the color reflected by the microcavity in the off state.

The color filter may be provided on an opposite surface of the transparent substrate to the intermediate layer. However, preferably the color filter is provided on the same side of the transparent substrate as the or each intermediate layer. With this arrangement, the color filter is closer to the emitting layer and potential parallax problems are avoided.

Preferably, the color filter is the same color as that emitted by the microcavity for increasing contrast of the electroluminescent device. For example, in one embodiment of the invention a microcavity optimized or emitting red light reflects green light in the off state. By adding a red color filter, the off state becomes black enhancing the contrast, while in the on state the filter is transmissive to red light emitted by the microcavity. With this arrangement contrast is enhanced without significant luminous loss as is the case when a circular polarizer is used. The color of reflected light in the off state will depend on the material used for the intermediate layer and also the structure of the microcavity. For arrangements in which, for example, a green emitting polymer is used, the microcavity is optimized for the green color, and a green colored filter may be used. Similarly, for a blue emitter, a blue-colored filter may be used.

The applicant recognizes that the advantageous effect achieved by providing an organic light-emissive device comprising a microcavity and a color filter is not limited to the particular arrangement described above. Thus, in a more general form, there may be provided an organic electroluminescent device comprising: a first electrode for injecting charge of a first polarity; a second electrode for injecting charge of a second polarity opposite to said first polarity; and an organic light-emitting layer disposed between the first and the second electrode, wherein the second electrode is reflective and the first electrode is semi-transparent whereby a microcavity is provided between the first and second electrodes, wherein a color filter is provided at an opposite side of the first electrode to the organic light-emitting material. The electrodes may comprise a number of layers providing a suitable reflectance to form the microcavity (for example, the intermediate layer(s) previously described). The color filter is preferably the same color as that emitted by the microcavity. This will be a different color from that emitted by the light-emissive material in the light-emitting layer as the microcavity will shift the wavelength of light.

Preferably, a single intermediate layer is provided, disposed between, and in contact with, the substrate and the first electrode. The provision of a single intermediate layer of material ensures that the aforementioned problems associated with the use of a QWS are avoided. Furthermore, a single intermediate layer of material is cheaper and easier to provide compared to a QWS.

Preferably, the first electrode is either: metallic and has a thickness of between 5 and 30 nm; or is an inorganic oxide with a thickness of between 50 and 150 nm. This is because, as the thickness of the first electrode becomes too small the conductivity of the film and/or the films structural integrity decreases. Preferably, electric contacts are provided directly to the first electrode. If a conductive material is utilized for the intermediate layers then electrical contacts may be provided to the intermediate layers. However, as the intermediate layers are selected for their optical properties rather than their electrical properties, for many intermediate layer materials it is advantageous that the electrical contacts are provided directly to the first electrode so as to avoid the intermediate layers detrimentally affecting the electrical properties of the device. In particular, if the intermediate layers are provided by a high refractive index dielectric material which does not have a high conductivity then it is advantageous to apply the electrical contacts directly to the first electrode.

An advantage of using a dielectric material as opposed to a metal for the intermediate layer is that the intermediate layer does not need to be patterned due to its lower conductivity. If a highly conductive material is used for the intermediate layer then the layer may require patterning so as to avoid shorting pathways in the device.

In one embodiment of the invention, the organic electroluminescent device comprises a plurality of pixels forming a display, each pixel having its own microcavity. The substrate of such a display may be common to the plurality of pixels. Furthermore, the or each intermediate layer may be common to the plurality of pixels.

For an active matrix display, the substrate comprises a plurality of thin film transistors forming an active matrix back plane. In one such an arrangement a plurality of first electrodes are provided and a single second electrode. In contrast, for a passive matrix display a plurality of first electrodes and a plurality of second electrodes may be provided.

Optionally, the display comprises pixels which emit different colors. In such a multicolor display it is preferred that the size of the pixel's microcavities are different for emitting the different colors. That is, the cavities are tuned for a particular wavelength. The cavity size may be varied by, for example, varying the thickness of the first electrode (or one of the other layers of materials within the light emitting structures). Alternatively, the display may be monochrome in which case the cavity size of all the light-emitting structures is preferably the same.

According to the first aspect of the invention there is also provided a transparent substrate for an organic electroluminescent device, the transparent substrate comprising a layer of transparent material, a layer of transparent or semitransparent conductive material disposed over the layer of transparent material, and one or more intermediate layers of a dielectric material having a refractive index greater than 1.8 or a metal material disposed between the layer of transparent material and the layer of conductive material forming a semi-transparent mirror, all the intermediate layers disposed between the layer of transparent material and the layer of conductive material having a surface furthest from the layer of transparent material which is not more than 150 nm from a surface of the conductive material furthest from the layer of transparent material.

According to the first aspect of the invention there is also provided a use of the substrate described herein in a method of manufacturing an organic electroluminescent device.

According to the first aspect of the invention there is also provided a method of manufacturing an organic electroluminescent device as described herein, the method comprising the steps: providing a prefabricated substrate; and depositing the other layers of the organic electroluminescent device thereon.

According to the first aspect of the invention there is also provided an organic electroluminescent device comprising: a transparent substrate; a first electrode disposed over the substrate for injecting charge of a first polarity; a second electrode disposed over the first electrode for injecting charge of a second polarity opposite to said first polarity; an organic light-emitting layer disposed between the first and the second electrode, wherein the second electrode is reflective, the first electrode is transparent or semi-transparent, and an intermediate layer of dielectric material with a refractive index greater than 1.8 or a metal material is disposed between, and in contact with, the substrate and the first electrode forming a semi-transparent mirror whereby a microcavity is provided between the reflective second electrode and the semi-transparent mirror.

According to the first aspect of the invention there is also provided a transparent substrate for an organic electroluminescent device, the transparent substrate comprising a layer of transparent material, a layer of transparent or semitransparent conductive material disposed over the layer of transparent material, and a layer of dielectric material having a refractive index greater than 1.8 or a metal material disposed between, and in contact with, the layer of transparent material and the layer of conductive material forming a semi-transparent mirror.

Thus, embodiments of the invention may be provided with a single intermediate layer. The provision of a single intermediate layer avoids the aforementioned problems associated with the use of a QWS as the resultant microcavity is not as strong. Unlike the QWS, the single intermediate layer does absorb some light. However, as the microcavity formed is weaker than that formed by a QWS, light emitted from the light-emitting layer is not trapped so strongly within the cavity. As a result, absorption from the other layers of material within the cavity is reduced. Surprisingly, it has been found that any increase in absorbance by the single intermediate layer when compared to a QWS can be off-set by a reduction in absorbance by the other layers within the cavity while still achieving the advantages of color enhancement provided by a microcavity. A single layer of material is cheaper and easier to provide compared to a QWS. Furthermore, the single intermediate layer forms a smaller microcavity when compared with a QWS as the net reflection from the single intermediate layer is closer to the second reflecting electrode than the net reflection achieved from a QWS. As such, the mode spacing is larger for the single intermediate layer compared to a QWS. Accordingly, less modes are accessible which results in a decrease in the intensity of certain parts of the spectrum resulting in an overall enhancement of the spectrum which is superior to a QWS.

If the reflectance from the first electrode is small, then this reflectance could be ignored. In this case, it would not be necessary to locate the other reflecting surfaces within a certain distance of the electrode surface. However, it would require that all the reflective surfaces are themselves within a certain distance of each other so as to avoid providing more than one effective reflection (i.e. all the reflective surfaces of the reflector would need to be within a distance of ¼ wavelength). Thus, in accordance with the first aspect of the invention there is also provided an organic electroluminescent device comprising: a transparent substrate; a first electrode disposed over the substrate for injecting charge of a first polarity; a second electrode disposed over the first electrode for injecting charge of a second polarity opposite to said first polarity; an organic light-emitting layer disposed between the first and the second electrode comprising an organic light-emissive material having a peak emission wavelength, wherein the second electrode is reflective, the first electrode is transparent or semi-transparent, and one or more intermediate layers of a dielectric material with a refractive index greater than 1.8 or a metal material are disposed between the substrate and the first electrode forming a semi-transparent mirror whereby a microcavity is provided between the reflective second electrode and the semi-transparent mirror, all the intermediate layers disposed between the substrate and the first electrode having a surface nearest the organic light-emitting layer within a distance of less than ¼ the peak emission wavelength. That is, all the reflective surfaces of the intermediate layers are located within a distance of less than ¼ the peak emission wavelength. This ensures that the reflective surfaces of the intermediate layers effectively act as a single reflective surface in contrast to a QWS which has multiple in-phase reflections.

According to the second aspect of the invention there is provided a multilayer display device comprising first and second electrodes and incorporating anti-reflection means associated with the first electrode, wherein the device further comprises anti-reflection interference means associated with the second electrode. The anti-reflection means associated with the first electrode may comprise a Luxell Black Layer. Accordingly, the anti-reflection interference means associated with the second electrode may advantageously be applied to the anode/substrate interface to combat unwanted reflections from this interface, without using a circular polarizer.

Preferably said anti-reflection interference means comprises an anti-reflective layer.

The anti-reflective layer may be a discrete layer adjacent the second electrode, and may be formed from a material selected from a group comprising: silicon oxynitride, magnesium fluoride, titanium dioxide, silicon dioxide, zinc selenide, silicon nitride. Silicon oxynitride of formula $SiO_xN_y$ is particularly preferred. The values of x and y may be selected to tune the optical properties of the antireflective layer, as required. Other materials are possible, as will be apparent to those skilled in the art.

Alternatively, the anti-reflective layer may be integrally formed at the surface of the second electrode. In an embodiment the second electrode comprises indium tin oxide and the anti-reflective layer is integrally formed as an oxygen-rich surface layer of indium tin oxide.

As a further alternative, the anti-reflective layer may be formed on the surface of the substrate adjacent the second electrode. In an embodiment the substrate comprises glass and the anti-reflective layer is formed as a surface layer of silicon oxynitride. Advantageously, the anti-reflective layer may also function as a buffer layer to prevent matter (e.g. sodium) from leaching out of the substrate.

Preferably the refractive index of the anti-reflective layer is substantially equal to the square root of the product of the refractive indices of the layers either side of the anti-reflective layer.

Preferably the anti-reflective layer has a thickness substantially equal to a quarter of a nominal wavelength of visible light divided by the refractive index of the anti-reflective layer. Thicknesses of other odd-number multiples of the quarter wavelength divided by the refractive index of the anti-reflective layer may also be used.

According to the second aspect of the invention there is also provided a method of reducing reflection from a multilayer display device having first and second electrodes, said method comprising: providing anti-reflection means associated with the first electrode; and further providing anti-reflection interference means associated with the second electrode.

In certain embodiments, the anti-reflective layer may be formed using a technique selected from a group comprising: sputtering, evaporation, chemical vapor deposition.

The anti-reflective interference means of the second aspect of the invention may also form the semi-transparent mirror of the first aspect of the invention. That is, embodiments of the invention may be utilized to both reduce reflection of ambient light while increasing out-coupling of emitted light. As such, it will be understood that the features of the two aspects described herein may be combined in embodiments of the invention.

BRIEF DESCRIPTION OF THE DRAWINGS

For a better understanding of the invention and to show how the same may be carried in both effect, embodiments of the invention will now be described by way of example only with reference to the accompanying drawings, in which.

DETAILED DESCRIPTION OF THE PREFERRED EMBODIMENTS OF THE INVENTION

Embodiments of the first aspect of the invention will be described first.

Figure 1:
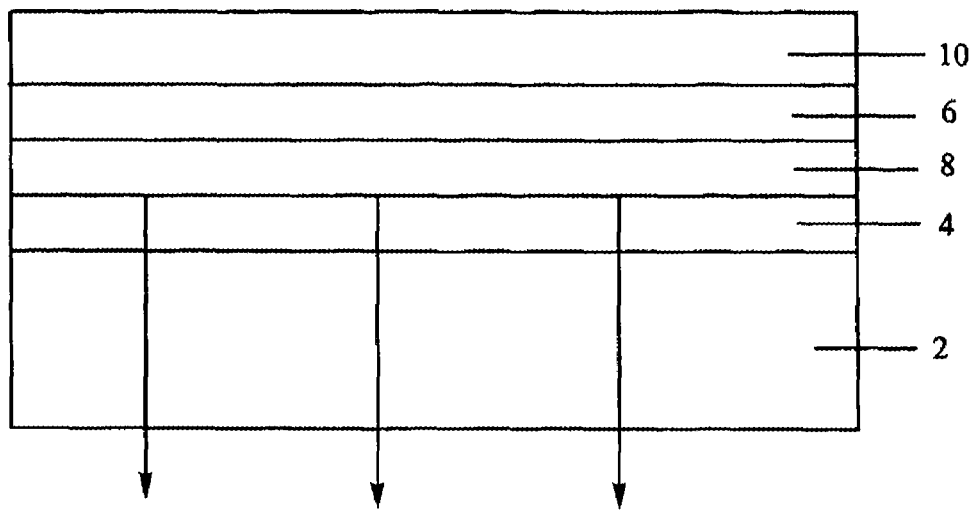
FIG. 1 shows a known bottom emitting organic electroluminescent device.
Figure 2:
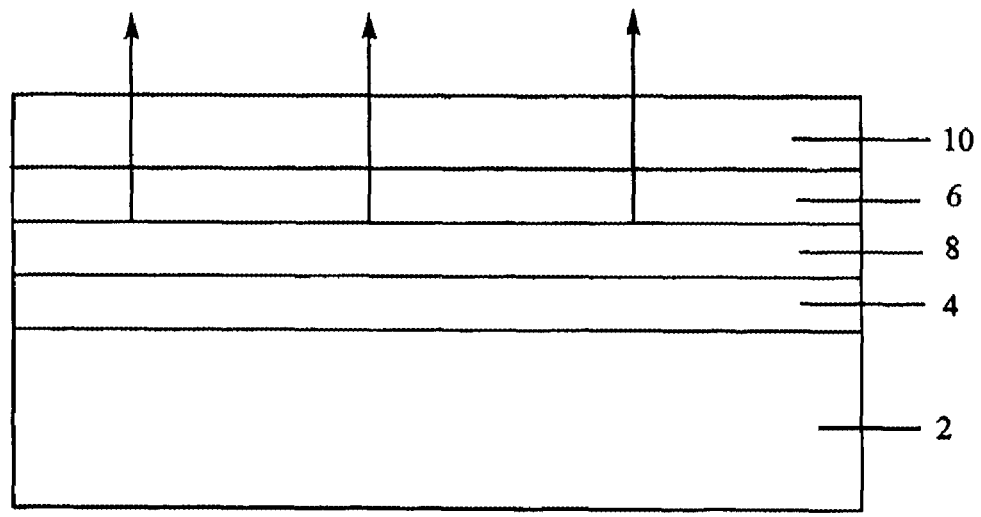
FIG. 2 shows a known top emitting organic electroluminescent device.
Figure 3:
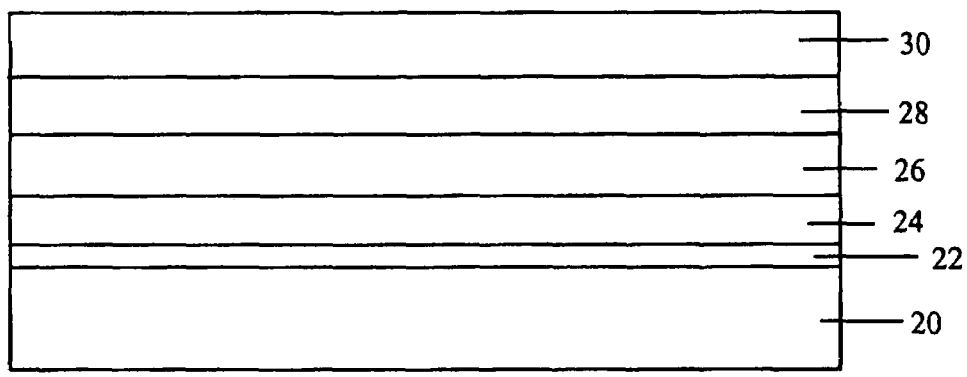
FIG. 3 shows an organic electroluminescent device according to a first embodiment of the invention.

FIG. 3 shows a bottom-emitting organic electroluminescent device comprising a glass substrate 20, a thin intermediate layer of silver 22 disposed on the glass substrate 20, an anode 24 comprising ITO disposed on the thin silver layer 22, a layer of PEDOT 26 disposed on the ITO 24, a light emitting polymer layer 28 disposed on the PEDOT 26 and a barium/aluminium cathode 30 disposed on the light-emitting polymer layer 28.

Optical modelling has shown that modifying the anode structure of the polymer light emitting diode structure by including a thin layer of semi-transparent metal improves optical out-coupling and also provides color tuning of the emission towards the PAL region.

Modelling has shown that the best materials for the intermediate layer are either high refractive index dielectrics (e.g. titanium dioxide, silicon oxynitride and silicon nitride) or metals that are transparent in the RGB region (e.g. silver or alloys such as Mg:Ag).

Figure 4:
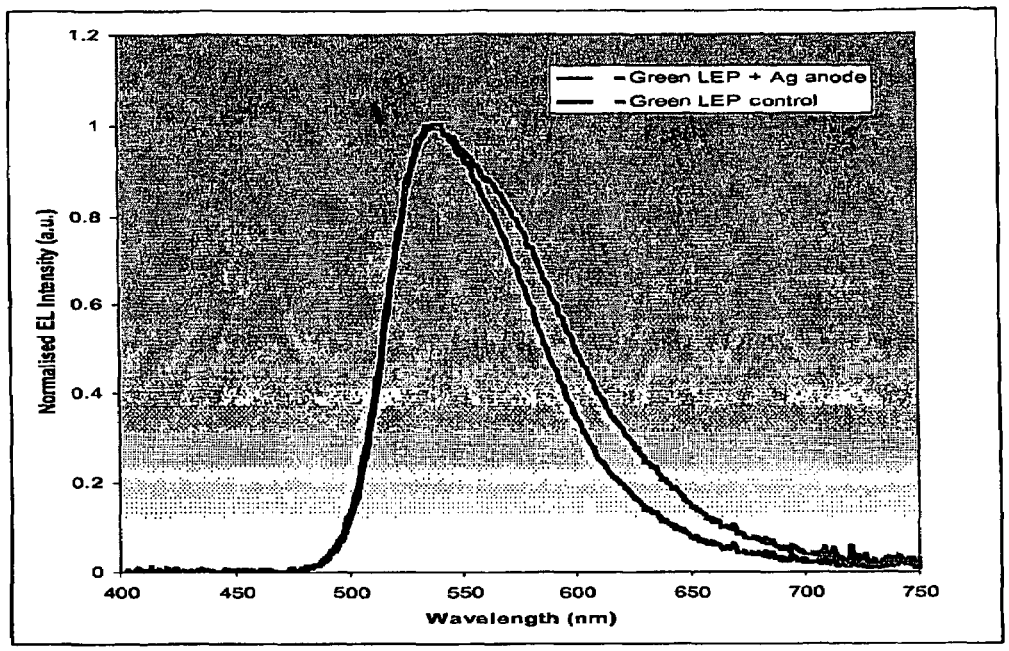
FIG. 4 shows a graph indicating the spectral shift achieved using a green emitting device of the type shown in FIG. 3.

FIG. 4 shows a graph indicating the spectral shift achieved using the device shown in FIG. 3 when compared with a device of comparable structure but without the intermediate silver layer. The device comprises a standard green emitting polymer.

In terms of CIE co-ordinates, the device without the intermediate silver layer was measured to be CIE x=0.41 y=0.57. The shifted spectrum of the device comprising the intermediate silver layer was measured to be CIE x=0.35 y=0.62.

Figure 5:
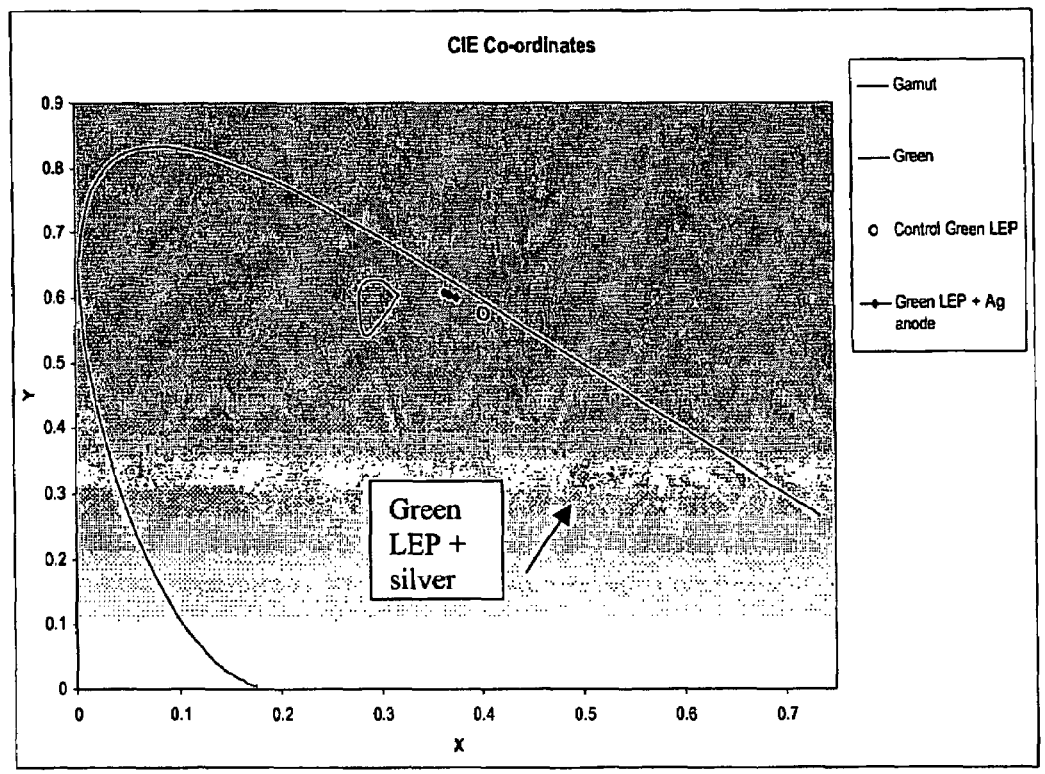
FIG. 5 shows the shift that is evident with respect to a CIE chart and PAL green using the green emitting device.

FIG. 5 shows the shift that is evident with respect to the CIE chart and the PAL green.

It has thus been shown that a thin silver layer may be used to improve color saturation. Furthermore, no color change was observed with changing viewing angle.

Figure 6:
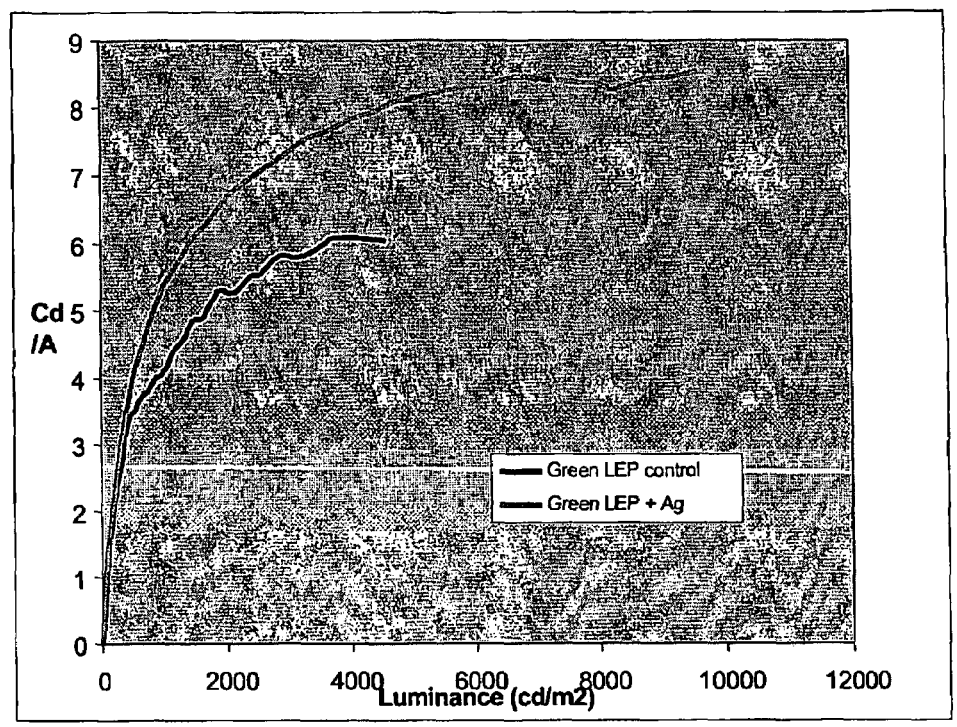
FIG. 6 shows an increase in efficiency against voltage for the green emitting device.

In terms of optical out-coupling, FIG. 6 shows an increase in efficiency against voltage for the device having the silver layer compared with the control. The voltage required to achieve a particular luminance value is lower compared with the control device and thus a greater lm/W value for the silver layer device is achieved. A contributing factor is the increase in anode conductivity due to the metal layer.

The present results are for devices which have not been fully optimized. Accordingly, by optimizing the device structure greater Cd/A values will be achieved.

Figure 7:
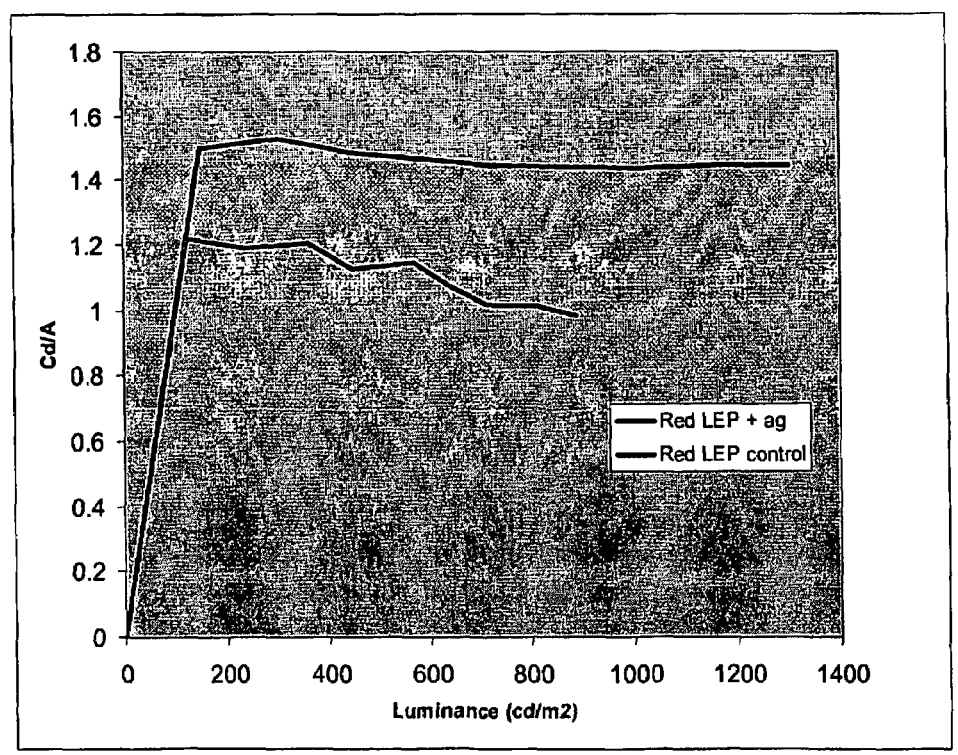
FIG. 7 shows an increase in efficiency against voltage measured for a red emitting device of the type illustrated in FIG. 3.

FIG. 7 shows an increase in efficiency against voltage for a red emitting device of the type illustrated in FIG. 3 in comparison with a control device in which the silver layer is absent. These devices utilize a standard red emitting polymer. Again, these devices have not been optimized as yet.

Figure 8:
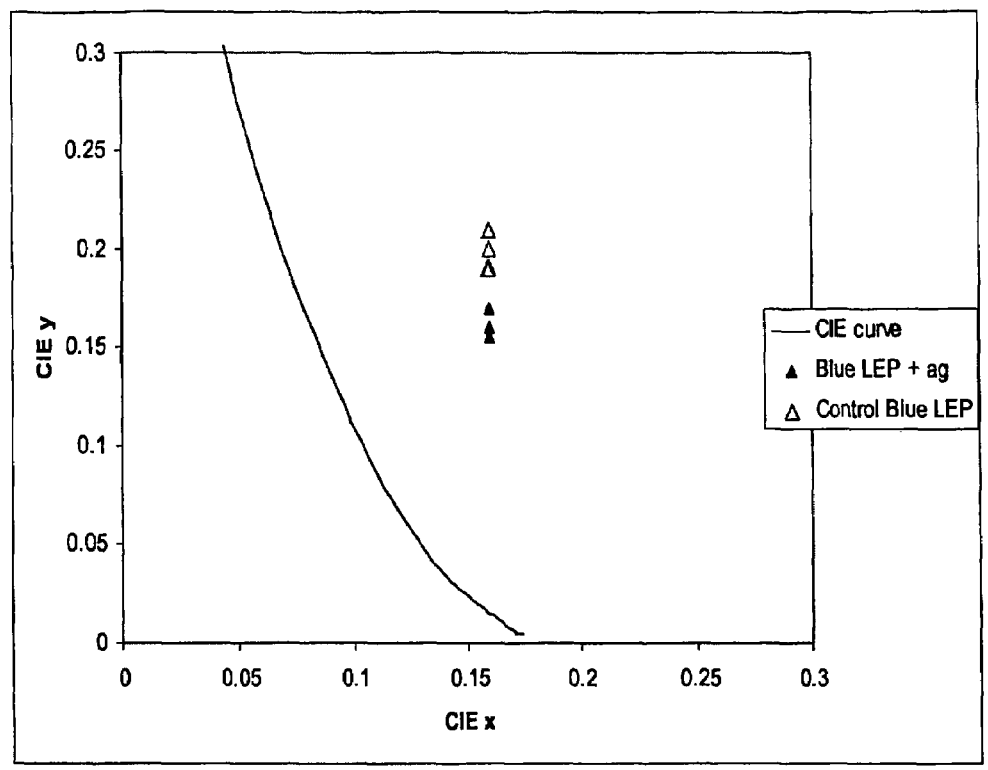
FIG. 8 shows a CIE plot for blue emitting devices of the type illustrated in FIG. 3.

FIG. 8 shows a CIE plot for blue devices fabricated with and without the silver layer. The blue emission has been tuned from CIE x=0.17 y=0.20 to CIE x=0.16 y=0.16 by the provision of the silver layer.

FIG. 8 shows that the addition of a silver layer shifts the emission color to a better blue. In the particular embodiment illustrated, the PEDT layer is 50 nm thick. The other points on the graph are for a control without any silver at the anode side (but otherwise having the same device structure). The control showed no color shift towards the blue.

For best results, the intermediate layer should have good reflectivity and also good transmission. The layer must also be depositable on the substrate to form an optical coating.

Figure 9:
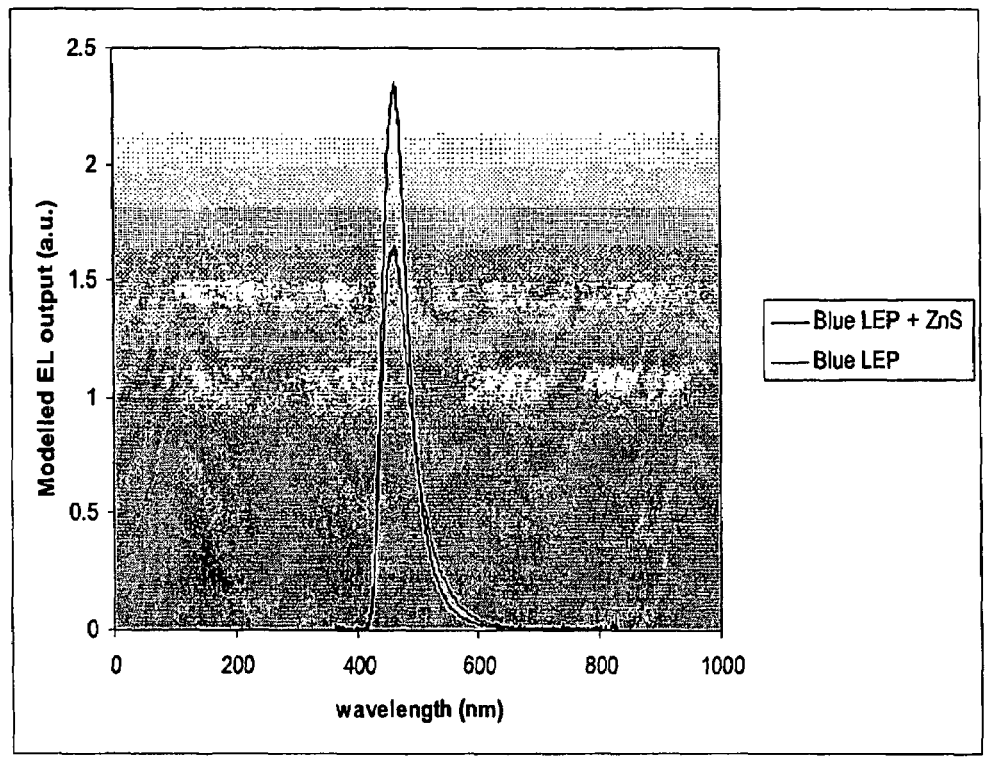
FIG. 9 illustrates modelling results showing an increase in emission for blue emitting devices of the type illustrated in FIG. 3.

FIG. 9 illustrates modelling results showing an increase in emission for a blue light-emitting device using ZnS in between a glass substrate and an ITO anode.

Figure 10:
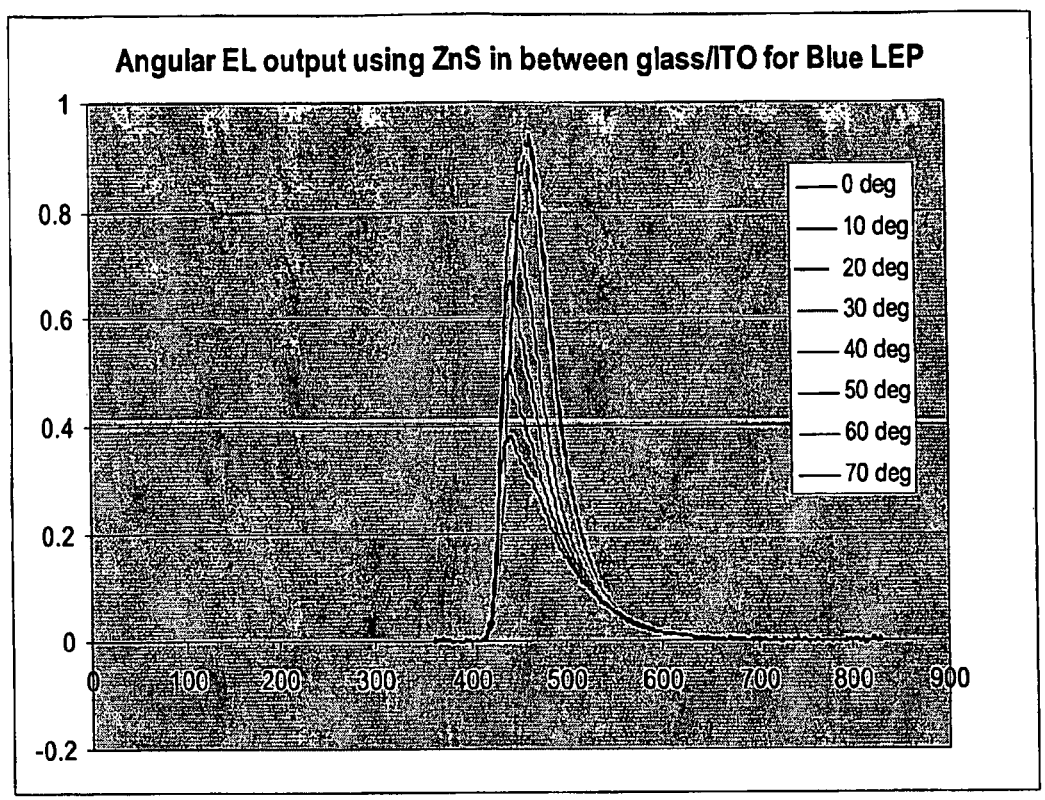
FIG. 10 shows spectra shifts with angle for a device of the type illustrated in FIG. 3.

FIG. 10 shows spectra shifts with angle for the blue light emitting device using ZnS in between a glass substrate and an ITO anode. The spectra show angle change from 0 to 70 degrees in air. A color shift is observed from CIE x=0.144 y=0.139 to x=0.16 y=0.156.

Figure 11:
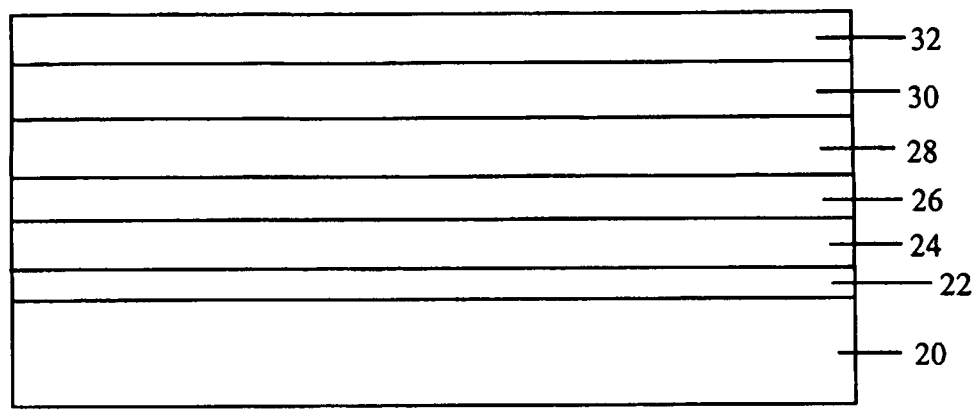
FIG. 11 shows an organic electroluminescent device according to another embodiment of the invention.
Figure 12:
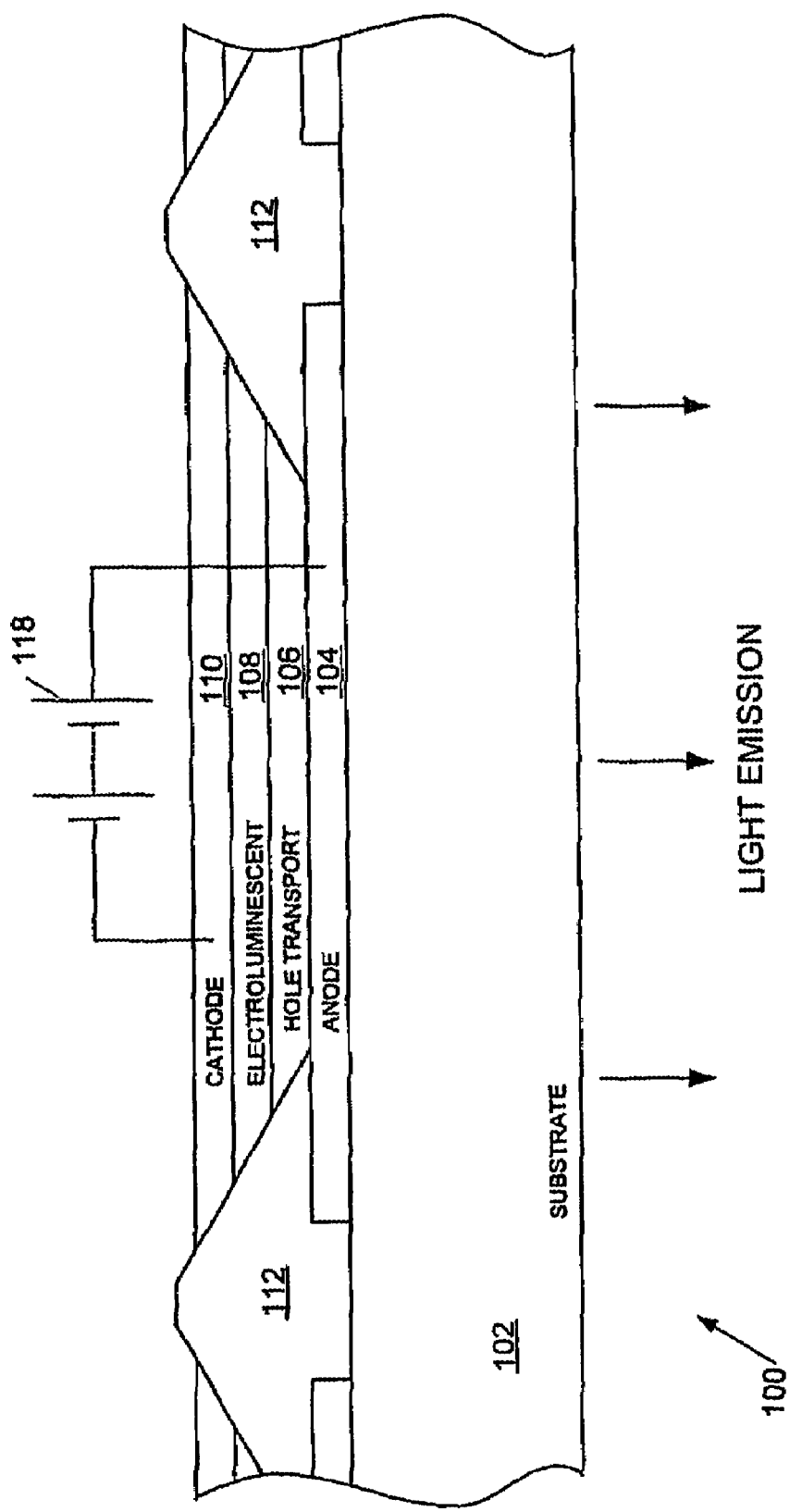
FIG. 12 illustrates a vertical cross section through a typical OLED device.
Figure 13:
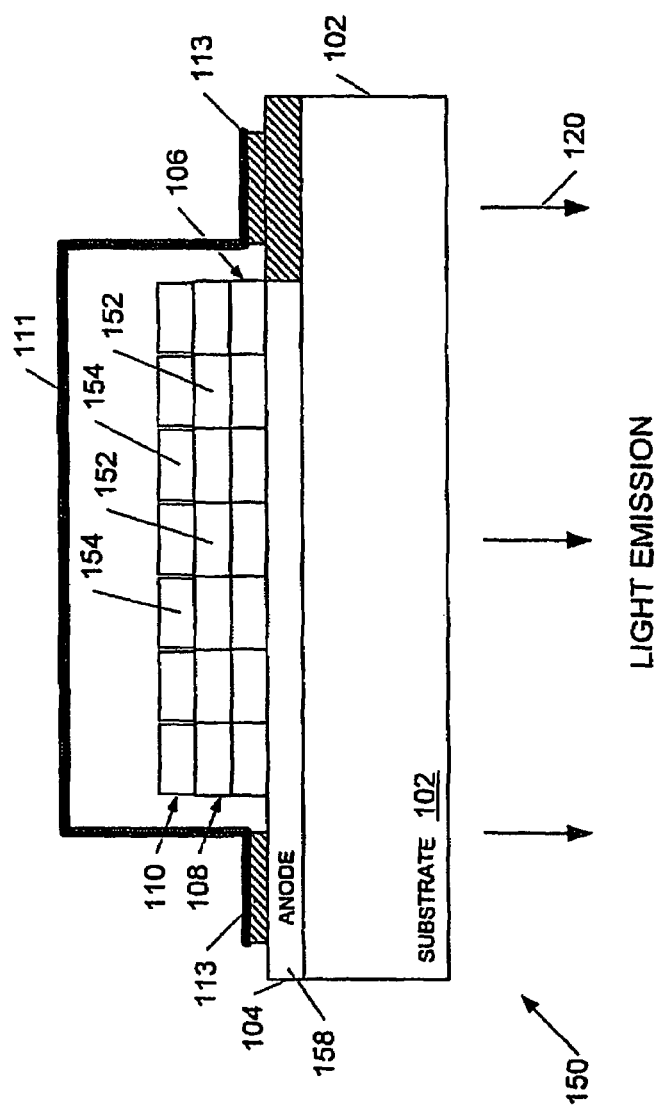
FIG. 13 illustrates a cross-section through a passive matrix OLED device.
Figure 14:
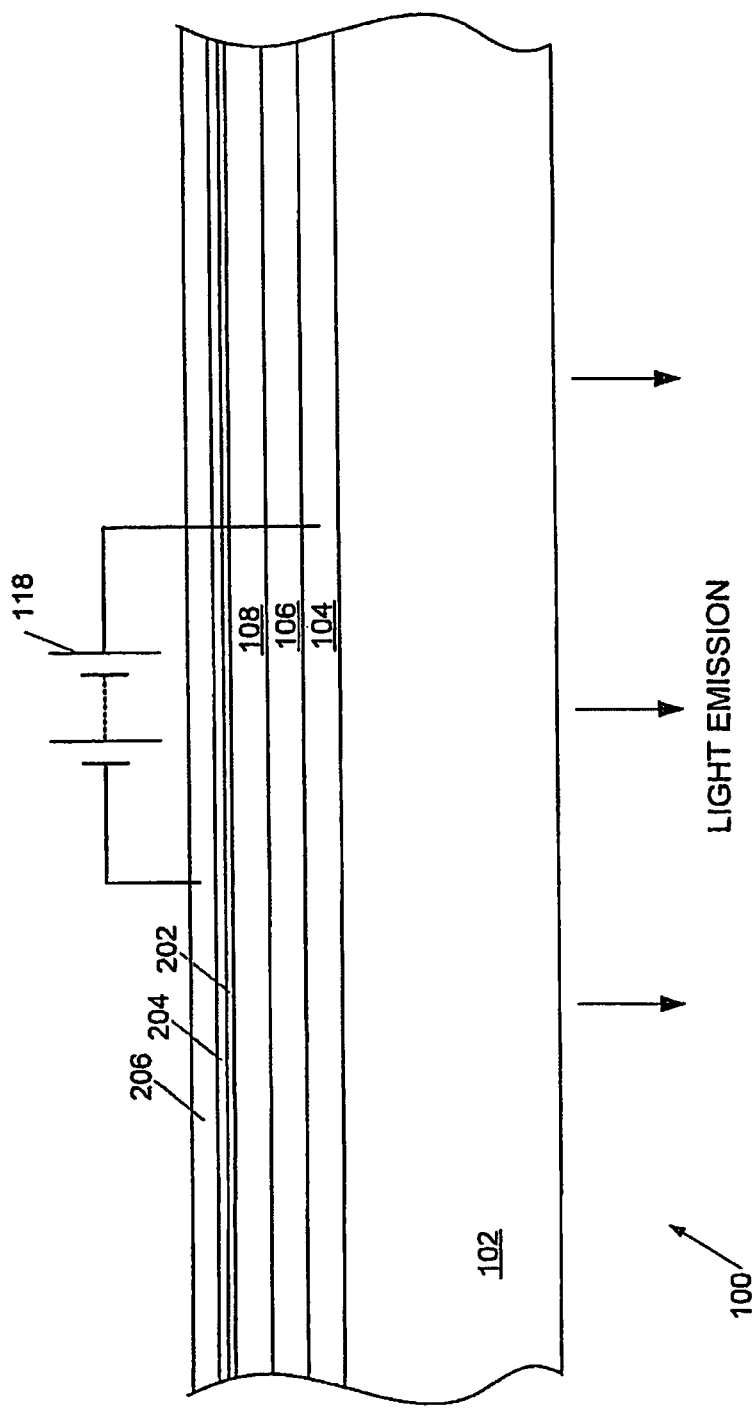
FIG. 14 illustrates a vertical cross section through a typical OLED device provided with a Luxell Black Layer.

FIG. 11 shows another embodiment of the invention. This embodiment is similar in structure to the previously described embodiment shown in FIG. 3 but with a color filter 32 on an outer surface of the glass substrate. The other layers of the device are the same.

Embodiments in accordance with the second aspect of the invention will now be described.

Figure 15:
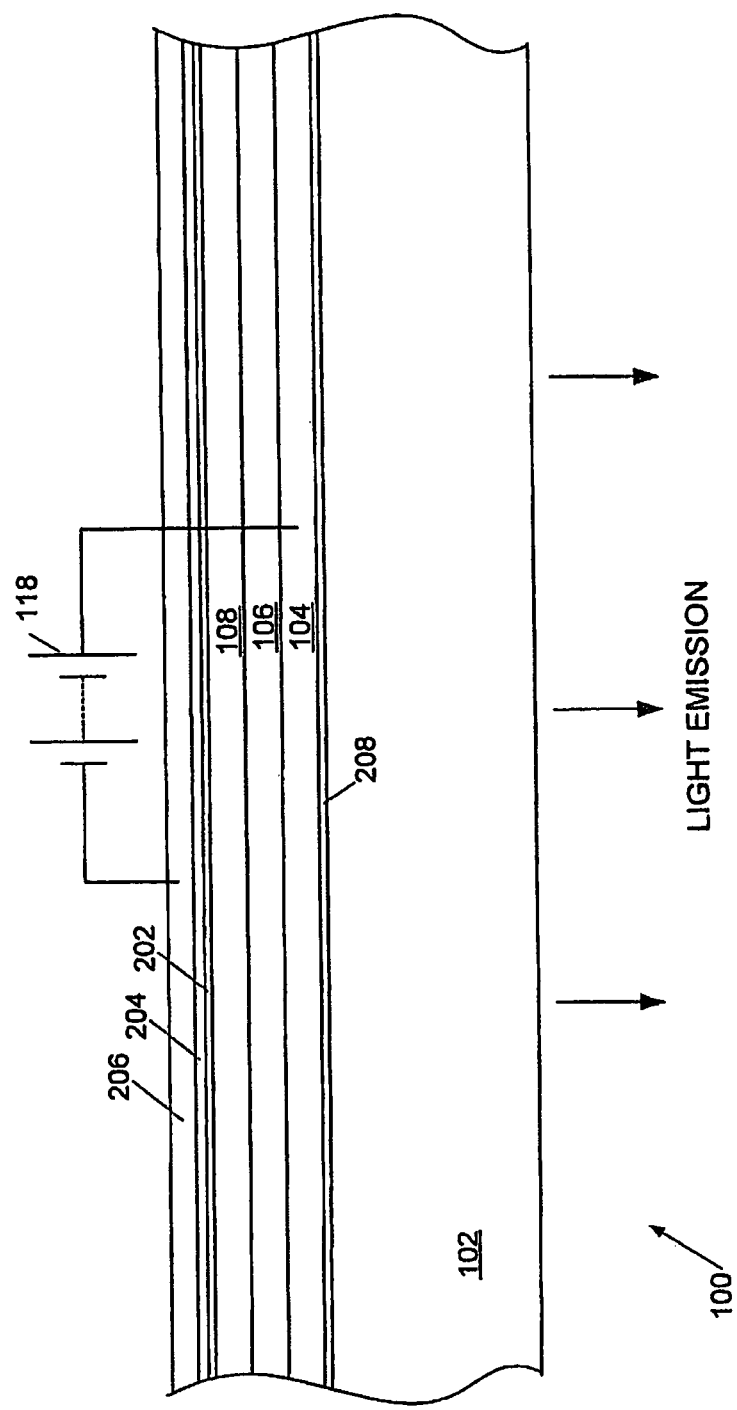
FIG. 15 illustrates the OLED device of FIG. 14 provided with an anti-reflective layer or coating in accordance with an embodiment of the invention.

As shown in FIG. 15, in one embodiment of the invention an anti-reflective coating or layer 208 is provided between the anode 104 and the substrate 102, to combat reflection of light from the anode 104. This anti-reflective layer 208 is intended to complement the Luxell Black Layer 202, 204, 206 provided to combat reflection from the cathode.

The anti-reflective layer 208 acts as a quarter-wavelength anti-reflective coating, and reduces reflection by destructive interference between incident and reflected light rays. The thickness of the anti-reflective layer is such that the incident and reflected rays are substantially 180° (one half wavelength) out of phase, thereby giving cancellation. Background information on the use of quarter-wavelength anti-reflective coatings may be obtained from U.S. Pat. No. 5,508,091.

The refractive index of the anode material $n_A$ and the refractive index of the substrate $n_S$ should be taken into account when determining both the ideal refractive index $n_{AR}$ and the ideal thickness $t_{AR}$ of the anti-reflective layer 208.

The ideal refractive index $n_{AR}$ of the anti-reflective layer is given by:

$$n_{AR} = \sqrt{n_A \times n_S}.$$

The ideal thickness $t_{AR}$ of the anti-reflective layer is given by:

$$t_{AR} = \frac{\lambda}{4n_{AR}},$$

where $\lambda$ is a nominal wavelength (e.g. 550 nm) of visible light.

By way of example, for an ITO anode having a refractive index $n_A$ of approximately 1.85 in the visible range, and a silica substrate having a refractive index $n_S$ of approximately 1.5, the ideal refractive index $n_{AR}$ of the anti-reflective coating is approximately 1.7. Thus, for a nominal mid-range wavelength $\lambda$ of 550 nm, the corresponding ideal thickness $t_{AR}$ of the anti-reflective coating is approximately 80 nm.

Thicker anti-reflective layers 208 may be produced. To achieve destructive interference, the thickness of the anti-reflective layer 208 should be an odd-number multiple of the above-defined ideal thickness $t_{AR}$ (e.g. 3 $t_{AR}$ or 5 $t_{AR}$). However, the presently preferred thickness is $t_{AR}$ since with thicker layers the bandwidth of the filtering deteriorates and the filtering becomes effective only over a comparatively narrow bandwidth around the nominal wavelength $\lambda$. It is therefore advantageous to make the anti-reflective layer 208 as thin as possible, ideally $t_{AR}$.

The anti-reflective layer 208 is provided in combination with a Black Layer 202, 204, 206, and provides the advantage that the Black Layer no longer has to compensate remotely for reflections from the interface between the anode 104 and the substrate 102.

As will be appreciated by those skilled in the art, the thicknesses of both the Luxell Black Layer 202, 204, 206 and the anti-reflective coating 208 may be optimized depending on the materials used to form the OLED device, its configuration and intended application.

Figure 16:
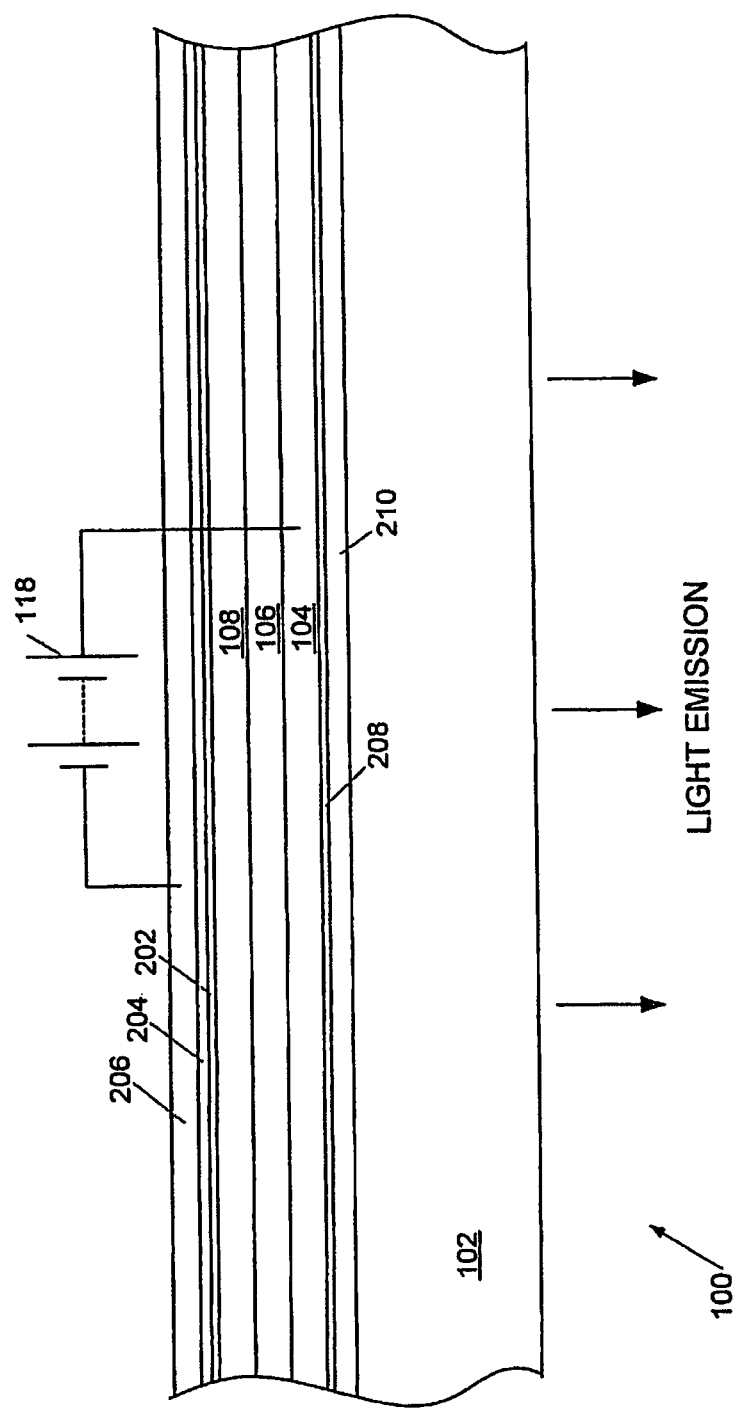
FIG. 16 illustrates the OLED device of FIG. 15 in which the substrate incorporates a buffer layer to prevent sodium leaching out of the substrate.

The substrate 102 may be made from soda lime glass, which is readily available and inexpensive. However, a potential problem is that sodium from the glass is susceptible to leach from the glass into the layers deposited thereon. Accordingly, as shown in FIG. 16, the surface of the substrate 102 adjacent the multilayer structure may incorporate a buffer layer 210 (e.g. $SiO_2$) which prevents leaching of sodium from the soda lime glass and is optically matched to the glass. This buffer layer 210 may be integrally formed at the surface of the substrate 102, or may be deposited as a discrete layer.

Possible materials from which the anti-reflective coating 208 may be made include silicon oxynitride ($SiO_xN_y$), magnesium fluoride (MgF), titanium ($TiO_2$), silicon dioxide ($SiO_2$), zinc selenide (ZnSe) and silicon nitride ($Si_3N_4$). Silicon dioxide (silica) is not generally useful as a single anti-reflective layer directly on glass, as its refractive index is substantially the same as that of glass, but it can beneficially be used within a multilayer structure adjacent materials other than glass.

The anti-reflective coating 208 may be deposited as a single layer (which is preferred) or as a plurality of layers, although as thin an overall layer as possible is desirable in order to achieve effective filtering over a wide bandwidth. Deposition may be performed using sputtering (which is relatively quick) or evaporation (which is comparatively slow and consequently more expensive, but achieves a better quality deposited layer). In addition to sputtering and evaporation techniques, any other technique capable of depositing a thin film may be used, such as chemical vapour deposition (CVD).

As an alternative to being formed as a discrete layer, the anti-reflective coating 208 may be integrally formed at the surface of one of the layers against which the anti-reflective coating is desired. This may be achieved by modifying the composition of the anode material during deposition to form an integral surface layer of the required thickness and having the required refractive index to enable it to function as an anti-reflective layer. For example, an anti-reflective coating may be integrally formed at the surface of an ITO anode 104. This may be achieved by modifying the deposition process of the indium tin oxide to produce an oxygen-rich surface layer of the anode 104 adjacent the substrate 102, the oxygen-rich surface layer having a lower refractive index than the rest of the ITO layer and thereby acting as the anti-reflective coating.

As an alternative, an anti-reflective coating may be formed at the surface of the substrate 102 adjacent the anode 104. If a buffer layer 210 is employed as shown in FIG. 16, then this buffer layer may also serve as the anti-reflective coating 208. This may be achieved using silicon oxynitride ($SiO_xN_y$), which is potentially suitable for serving both as a buffer layer and an anti-reflective coating. It will be appreciated that a layer serving as both the buffer layer and the anti-reflective coating will differ from a standard buffer layer in that it will be thicker and will not have a refractive index matched to the substrate.

As described above, in the presently preferred embodiments the anti-reflective layer 208 is provided between the substrate 102 and the anode 104, to minimize reflections from the anode. However, one or more anti-reflective layers could in principle be employed to minimize reflections from other interface(s) within a multilayer structure. The anti-reflective layer could be applied between other adjacent layers within the structure, provided the material chosen for the anti-reflective layer has an appropriate work function and conductivity.

The anti-reflective layer 208 is not limited to use in conjunction with an interference-based anti-reflective means such as the Black Layer. Indeed, the anti-reflective layer 208 may be used to complement any other anti-reflection means associated with an electrode in the structure (e.g. a transparent cathode).

While this invention has been particularly shown and described with reference to preferred embodiments, it will be understood to those skilled in the art that various changes in form and detail may be made without departing from the scope of the invention as defined in the appendant claims.

The invention claimed is:

1. An organic electroluminescent device comprising:
a transparent substrate;
a first electrode disposed over the substrate for injecting charge of a first polarity;
a second electrode disposed over the first electrode for injecting charge of a second polarity opposite to said first polarity;
an organic light-emitting layer disposed between the first and the second electrode, wherein the second electrode is reflective, the first electrode is transparent or semi-transparent, and one or more intermediate layers of dielectric material with a refractive index greater than 1.8 or a metal material is disposed between the substrate and the first electrode forming a semi-transparent mirror whereby a microcavity is provided between the reflective second electrode and the semi-transparent mirror, all the intermediate layers disposed between the substrate and the first electrode having a surface nearest the organic light-emitting layer not more than 150 nm from a surface of the first electrode nearest the organic light-emitting layer.

2. An organic electroluminescent device according to claim 1, wherein all the intermediate layers disposed between the substrate and the first electrode have the surface nearest the organic light-emitting layer less than 150 nm from the surface of the first electrode nearest the organic light-emitting layer.

3. An organic electroluminescent device according to claim 1, wherein the or each intermediate layer is transparent to visible light having a wavelength over 400 nm.

4. An organic electroluminescent device according to claim 1, wherein the or each intermediate layer comprises independently one of the group consisting of titanium dioxide, silicon oxynitride, silicon nitride, zinc sulphide, silver, and silver alloys.

5. An organic electroluminescent device according to claim 1, wherein the intermediate layer, or at least one of the intermediate layers, comprises a metal material and has a thickness of 1-20 nm.

6. An organic electroluminescent device according to claim 1, wherein the intermediate layer, or at least one of the intermediate layers, comprises a dielectric material with a refractive index greater than 1.8 and has a thickness of 10-100 nm.

7. An organic electroluminescent device according to claim 1, wherein the first electrode is transparent to visible light having a wavelength over 400 nm.

8. An organic electroluminescent device according to claim 1, wherein the first electrode has a work function over 4.0 eV.

9. An organic electroluminescent device according to claim 1, wherein the first electrode comprises ITO.

10. An organic electroluminescent device according to claim 1, wherein the transparent substrate has a refractive index of between 1.4 and 1.7.

11. An organic electroluminescent device according to claim 10, wherein the transparent substrate comprises glass or plastic.

12. An organic electroluminescent device according to claim 1, wherein the substrate comprises a color filter.

13. An organic electroluminescent device according to claim 12, wherein the color filter is disposed on the same side of the substrate as the or each intermediate layer.

14. An organic electroluminescent device according to claim 12, wherein the color filter is the same color as that emitted by the microcavity.

15. An organic electroluminescent device according to claim 1, wherein a single intermediate layer is provided, disposed between, and in contact with, the substrate and the first electrode.

16. An organic electroluminescent device according to claim 1, wherein the first electrode is either: metallic and has a thickness of between 5 and 30 nm; or is an inorganic oxide with a thickness of between 50 and 150 nm.

17. An organic electroluminescent device according to claim 1, wherein electric contacts are provided directly to the first electrode.

18. An organic electroluminescent device according to claim 1, comprising a plurality of pixels forming a display, each pixel having its own microcavity.

19. An organic electroluminescent device according to claim 18, wherein the substrate is common to the plurality of pixels.

20. An organic electroluminescent device according to claim 18, wherein the or each intermediate layer is common to the plurality of pixels.

21. An organic electroluminescent device according to claim 18, wherein the display comprises a plurality of first electrodes.

22. An organic electroluminescent device according to claim 18, wherein the substrate comprises an active matrix back plane.

23. An organic electroluminescent device according to claim 22, wherein the display comprises a single second electrode common to the plurality of pixels.

24. An organic electroluminescent device according to claim 21, wherein the display comprises a plurality of second electrodes.

25. An organic electroluminescent device according to claim 18, wherein the pixels emit different colors, the size of the pixels' microcavities being different for emitting the different colors.

26. An organic electroluminescent device according to claim 25, wherein the thickness of the first electrode is variable for forming cavities of differing sizes.

27. An organic electroluminescent device according to claim 18, wherein the pixels emit the same color forming a monochrome display, the size of the pixels' microcavities being the same.

28. An organic electroluminescent device according to claim 24, wherein the pixels emit different colors, the size of the pixels' microcavities being different for emitting the different colors.

29. A substrate for an organic electroluminescent device, the substrate comprising a layer of transparent material, a layer of transparent or semitransparent conductive material disposed over the layer of transparent material, and one or more intermediate layers of a dielectric material having a refractive index greater than 1.8 or a metal material disposed between the layer of transparent material and the layer of conductive material forming a semi-transparent mirror, all the intermediate layers disposed between the layer of transparent material and the layer of conductive material having a surface furthest from the layer of transparent material which is not more than 150 nm from a surface of the conductive material furthest from the layer of transparent material.

30. A substrate according to claim 29, wherein all the intermediate layers disposed between the layer of transparent material and the layer of conductive material have the surface furthest from the layer of transparent material less than 150 nm from the surface of the conductive material furthest from the layer of transparent material.

31. A substrate according to claim 29, wherein the or each intermediate layer is transparent to visible light having a wavelength over 400 nm.

32. A substrate according to claim 29, wherein the or each intermediate layer comprises independently one of titanium dioxide, silicon oxynitride, silicon nitride, zinc sulphide, silver and silver alloys.

33. A substrate according claim 29, wherein the intermediate layer, or at least one of the intermediate layers, comprises a metal material and has a thickness of 1-20 nm.

34. A substrate according to claim 29, wherein the intermediate layer, or at least one of the intermediate layers, comprises a dielectric material with a refractive index greater than 1.8 and has a thickness of 10-100 nm.

35. A substrate according to claim 29, wherein the layer of conductive material is transparent to visible light having a wavelength over 400 nm.

36. A substrate according to claim 29, wherein the layer of conductive material has a work function over 4.0 eV.

37. A substrate according to claim 29, wherein the layer of conductive material comprises ITO.

38. A substrate according to claim 29, wherein the transparent material comprises a color filter.

39. A substrate according to claim 38, wherein the color filter is disposed on the same side of the transparent material as the or each intermediate layer.

40. A substrate according to claim 29, wherein the transparent material has a refractive index of between 1.4 and 1.7.

41. A substrate according to claim 40, wherein the transparent material comprises glass or plastic.

42. A substrate according to claim 29, wherein a single intermediate layer is provided, disposed between, and in contact with, the layer of transparent material and the layer of conductive material.

43. A substrate according to claim 29, wherein the layer of conductive material is either: metallic and has a thickness of between 5 and 30 nm; or is an inorganic oxide with a thickness of between 50 and 150 nm.

44. An organic electroluminescent device comprising:
a transparent substrate;
a first electrode disposed over the substrate for injecting charge of a first polarity;
a second electrode disposed over the first electrode for injecting charge of a second polarity opposite to said first polarity;
an organic light-emitting layer disposed between the first and the second electrode, wherein the second electrode is reflective, the first electrode is transparent or semitransparent, and an intermediate layer of dielectric material with a refractive index greater than 1.8 or a metal material is disposed between, and in contact with, the substrate and the first electrode forming a semi-transparent mirror whereby a microcavity is provided between the reflective second electrode and the semi-transparent mirror.

45. A transparent substrate for an organic electroluminescent device, the transparent substrate comprising a layer of transparent material, a layer of transparent or semitransparent conductive material disposed over the layer of transparent material, and a layer of dielectric material having a refractive index greater than 1.8 or a metal material disposed between, and in contact with, the layer of transparent material and the layer of conductive material forming a semi-transparent mirror.

46. A multilayer display device comprising first and second electrodes and incorporating anti-reflection means associated with the first electrode, wherein the device further comprises an anti-reflective layer integrally formed at a surface of the second electrode.

47. A multilayer display device as claimed in claim 46, wherein the second electrode comprises indium tin oxide and the anti-reflective layer is integrally formed as an oxygen-rich surface layer of indium tin oxide.

48. A multilayer display device as claimed in claim 46, wherein the refractive index of the anti-reflective layer is substantially equal to the square root of the product of the refractive indices of the layers either side of the anti-reflective layer.

49. A multilayer display device as claimed in claim 46, wherein the anti-reflective layer has a thickness substantially equal to a quarter of a nominal wavelength of visible light divided by the refractive index of the anti-reflective layer.

50. A multilayer display device as claimed in claim 46, wherein the anti-reflection means associated with the first electrode comprises a bilayer of a partially transmissive, partially reflective layer and a phase changing layer located adjacent to the cathode.

51. A multilayer display device as claimed in claim 46, wherein the first electrode is a cathode and the second electrode is an anode.

52. A multilayer display device comprising first and second electrodes and incorporating anti-reflection means associated with the first electrode, wherein the device further comprises a discrete anti-reflective layer directly adjacent the second electrode.

53. A multilayer display device as claimed in claim 52, wherein the anti-reflective layer is formed from a material selected from a group comprising: silicon oxynitride, magnesium fluoride, titanium dioxide, silicon dioxide, zinc selenide, silicon nitride.

54. A multilayer display device as claimed in claim 52, wherein the anti-reflective layer is formed on a surface of a substrate directly adjacent the second electrode.

55. A multilayer display device as claimed in claim 54, wherein the substrate comprises glass and the anti-reflective layer is formed as a surface layer of silicon oxynitride.

56. A multilayer display device as claimed in claim 54, wherein the anti-reflective layer also functions as a buffer layer to prevent matter from leaching out of the substrate.

57. A multilayer display device as claimed in claim 52, wherein the refractive index of the anti-reflective layer is substantially equal to the square root of the product of the refractive indices of the layers either side of the anti-reflective layer.

58. A multilayer display device as claimed in claim 52, wherein the anti-reflective layer has a thickness substantially equal to a quarter of a nominal wavelength of visible light divided by the refractive index of the anti-reflective layer.

59. A multilayer display device as claimed in claim 52, wherein the anti-reflection means associated with the first electrode comprises a bilayer of a partially transmissive, partially reflective layer and a phase changing layer located adjacent to the cathode.

60. A multilayer display device as claimed in claim 52, wherein the first electrode is a cathode and the second electrode is an anode.

* * * * *